United States Patent [19]

Feinberg et al.

[11] 4,369,239

[45] Jan. 18, 1983

[54] PROCESS FOR PREPARATION OF PHOTOPOLYMERIZED DOT-ETCHABLE MASKS USING STAGING SOLUTION

[75] Inventors: Bernard Feinberg, Englishtown; James W. O'Neil, Howell, both of N.J.

[73] Assignee: E. I. Du Pont de Nemours and Company, Wilmington, Del.

[21] Appl. No.: 289,822

[22] Filed: Aug. 3, 1981

[51] Int. Cl.$^3$ .................... G03F 7/02; G03C 5/00; G03F 7/00; F23L 13/00
[52] U.S. Cl. ........................... 430/5; 430/302; 430/309; 430/324; 430/325; 430/331; 101/463.1; 101/464
[58] Field of Search ............. 430/11, 5, 302, 309, 430/324, 325, 331; 101/463.1, 464; 427/155, 259, 264, 271, 273, 277

[56] References Cited

U.S. PATENT DOCUMENTS 4,173,673  11/1979  Bratt et al. ................ 428/217

Primary Examiner—Richard L. Schilling

[57] ABSTRACT

Process for dot-etching a photopolymer layer no more than 0.015 mm thick and O.D. greater than 3.0 in the 350 to 400 nm region containing tone correctable image comprised of polymeric dots and lines having hardened upper skin which rests on softer undervolume having less degree of polymerization or hardening wherein a staging solution comprising a film forming hydrocarbon resin Mn of 500 to 3000 containing greater than 50% by weight aliphatic hydrocarbons, 25 to 50% by weight; aliphatic hydrocarbon solvent inert to photopolymer layer, 50 to 75% by weight, and optionally a dye or colorant and/or particulate material is applied to areas desired to protect; the solution is dried; the dot and line image is reduced by undercutting by mechanical action with a solvent of the softer undervolume and removing hardened polymer from the edges of the image; and the stage is removed by solvent therefor.

6 Claims, No Drawings

PROCESS FOR PREPARATION OF PHOTOPOLYMERIZED DOT-ETCHABLE MASKS USING STAGING SOLUTION

DESCRIPTION

TECHNICAL FIELD

This invention relates to a photopolymerization process using a staging solution. More particularly this invention relates to a process for dot-etching photopolymer elements.

BACKGROUND ART

The use of staging solutions in conjunction with graphic arts films of the silver halide type is known. The staging solution effectively permits dot-etching, i.e., the reduction in the size of the halftone, in desired areas while protecting the areas not to be etched. Recently dot-etching of photopolymer elements has become practical. U.S. Pat. No. 4,173,673 discloses dot-etchable masks which are effectively dot etched. Such photopolymer films are different from the silver halide graphic arts films not only in composition but after imagewise exposure and development provide images, e.g., halftone dot or line, which are raised above the support. Commercially available stage solutions utilized in conjunction with the photopolymer elements have been found to be detrimental to the photopolymer image, i.e., they attack the photopolymer layer and image. These staging solutions also have a tendency to flow beyond the point of application thereby preventing etching of a portion of the polymer image which is to be dot etched. Early attempts to make stages for shallow relief images, e.g., the elements of U.S. Pat. No. 4,173,673, were affected by capillary action which resulted in the tendency for the staging solution to spread beyond the area of application, i.e., wicking. Staging solutions with silver halide films are not affected by this problem.

An object of this invention is to provide a process for dot-etching imaged photopolymer layers using a staging solution which does not affect the photopolymer layer or image and remains in the areas of application without spreading or flowing beyond these areas.

DISCLOSURE OF THE INVENTION

In accordance with this invention there is provided in a process for dot-etching a photopolymerizable layer wherein the layer is no more than 0.015 mm thick and has an optical density greater than 3.0 in the 300 to 400 nm region and contains a tone correctable image comprised of polymeric dots or lines having a hardened upper skin which rests on a softer undervolume having a less degree of polymerization or hardening, the process comprising applying a staging solution to areas of the image layer that it is desired to protect, drying the staging solution to provide a stage, reducing the size of the polymeric dots or lines in unprotected areas by undercutting them with a solvent for the softer undervolume and removing hardened polymer from the edges of the hardened upper skin by mechanical action on the image, and removing the stage with a solvent therefor, the improvement wherein the staging solution having a Brookfield Model LVF viscosity in the range of 50 to 70 cps determined at 20° C./#1 spindle/60 rpm consists essentially of (a) at least one film forming hydrocarbon resin having a number average molecular weight in the range of about 500 to 3000 and melt viscosities of 10 poises at 237° C.±15° C., 100 poises at 207° C.±10° C., and 1000 poises at 184° C.±7° C., the resin containing greater than 50% by weight aliphatic hydrocarbons and being derived from synthetic and natural products, 25 to 50% by weight;

(b) at least one aliphatic hydrocarbon solvent which is inert to the photopolymerizable layer, 50 to 75% by weight;

(c) optionally a dye or colorant, and (d) optionally a finely divided particulate material, the weight percentages being based on the total weight of components (a) and (b).

In the process of this invention photopolymer elements are dot etched using a new improved staging solution. The staging solution has a Brookfield Model LVF viscosity in the range of 50 to 70 determined at 20° C./#1 spindle/60 rpm and consists essentially of at least one solvent, at least one solvent soluble hydrocarbon resin or polymer as defined above, and optionally but preferably a dye or colorant. The staging solution may also contain a finely divided particulate material such as fumed silica. The term "consisting essentially of" does not exclude the presence of other additives or components which do not prevent the advantages of the invention from being realized. The terms "dot etched" or "dot etching" mean the reduction of size of the halftone dot images as well as the reduction of size of any line images that may be present.

Useful solvent components are those that will not attack the photopolymer layer or image formed therein. It is desirable for the solvent to have a high evaporation rate so that the staging solution will form the dry stage in less than about 10 minutes. For less volatile solvents, the evaporation rate may be increased by circulating a stream of hot air over the stage. The solvent must be a good solvent for the hydrocarbon resin or polymer component. Examples of useful solvents for the staging solution include: alkanes $C_{6-11}$ carbon atoms, e.g., heptane, isoparaffins $C_{8-10}$ carbon atoms, isoparaffins $C_{9-11}$ carbon atoms, and mixtures thereof, etc. The solvents are present in an amount of 50 to 75% by weight based on the weight of the solvent and hydrocarbon resin or polymers.

Useful hydrocarbon resins or polymers which are soluble in the aforementioned solvent or mixtures of solvents are film forming resins having a number average molecular weight (Mn) in the range of about 500 to 3000, melt viscosities of 10 poises at 237° C.±15° C., 100 poises at 207° C.±10° C., and 1000 poises at 184° C.±7° C., the resin containing greater than 50% by weight aliphatic hydrocarbons, being derived from synthetic and natural products. The hydrocarbon resins or polymers are impermeable to treatment solutions used and yet are completely removable by solvents which do not affect the photopolymer element or image therein. The hydrocarbon resins or polymers are present in an amount of 25 to 50% by weight based on the weight of solvent and hydrocarbon resin or polymer. Examples of useful hydrocarbon resins include: Blackhawk ®500 naturally occurring unsubstituted hydrocarbon resin having melt viscosities of 10 poises at 224° C., 100 poises at 198° C. and 1000 poises at 178° C.; Piccovar ®AB 180, synthetic unsubstituted hydrocarbon resin having melt viscosities of 10 poises at 250° C., 100 poises at 216° C. and 1000 poises at 190° C.; Damar A/D naturally occurring unsubstituted hydrocarbon resin; and mixtures thereof; etc.

Optionally a dye or colorant is present in the staging solution in amounts up to about 5% by weight based on the total weight of staging solution, preferably about 1 to 3% by weight. The dye or colorant is present to color the solution so that it can more readily be determined in what areas it is applied. Useful dyes or colorants include: Automate®Red B (C.I. No. Solvent Red #164), Automate®Blue 8 (Solvent Blue #98), Du Pont Oil Red B (C.I. No. 164), Automate®Purple AS, etc.

The staging solution is applied to the areas of the imagewise exposed and developed photopolymer element which are not to be dot-etched. It is therefore desirable that the solution dry quickly and remain in the areas solely where it is applied. Application can be by painting using a brush or by rubbing with a cloth or other absorbent material. Other application means are by spraying, e.g., with an air brush, or by use of roller or felt tipped applicators. Since the dot and line images are generally fine, care must be taken in the application of the staging solution so that no damage to the image occurs. The staging solution provides a stage upon drying which can occur at ambient temperatures generally in less than about 7 minutes, preferably 3 to 5 minutes. Drying of the staging solution can occur at elevated temperatures by heating the element. Care must be taken to maintain the temperature below the range which may affect the element or image.

After drying the staging solution, the size of the photopolymer dot or line images unprotected by the stage are reduced in size by undercutting them with a solvent for the softer undervolume of the image and then removing hardened photopolymer from the edges of the hardened upper skin by mechanical action, e.g., rubbing, brushing or spraying, on the image. The dried protective stage is substantially insoluble in the solvent for the softer undervolume. Suitable solvents are those used in developing the images described below. The solvent in combination with the mechanical action have been found to reduce the size of the image, e.g., dots or lines, by at least 5%. More commonly a size reduction of 10% or more is carried out with the dot-etch process.

After the dot-etching step of the process the stage remaining on the element surface is removed with a solvent therefor. The solvent must not have any dilatory effect on the photopolymer element. Suitable solvents include the solvents used in forming the original staging solution, e.g., normal and isoparaffins as described above. The solvents can be applied with a slight amount of rubbing or force care being taken not to damage the etched image.

Dot-etchable solvent-processable photopolymer elements to which the staging solution is applied according to the inventive process comprise a support bearing a very thin actinic radiation photopolymerizable layer no more than 0.015 mm thick and having an optical density of at least 3.0 to the actinic radiation, the photopolymerizable layer comprised of an ethylenically unsaturated compound capable of forming a high polymer by free radical initiated, chain propagating, addition polymerization, an organic polymeric binder, a free radical generating addition polymerization initiator system activatable by actinic radiation in the spectral region of 300 nm or above, and optionally containing an actinic radiation absorber, the photopolymerizable layer being the outermost layer of the element or being contiguous to a removable cover sheet or an overcoat layer which is at least partially soluble in or permeable to a solvent for the photopolymerizable layer.

The photopolymerizable layer will ordinarily have a cover sheet or overcoat layer which is transparent to actinic radiation to protect the element against oxygen inhibition as well as physical damage. A high contrast, dot-etchable solvent-processable lithographic film element useful in the invention comprises in order, (1) a support, (2) a photopolymerizable layer having a thickness of no more than 0.0006 inch (0.015 mm) and an optical density of at least 3.0 in the actinic region, and (3) a removable cover sheet or overcoat layer which preferably is transparent to actinic radiation. By the term "overcoat layer" as used throughout is meant a coating in dry form over the photopolymerizable layer which is at least partially soluble in or permeable to a solvent for the photopolymerizable layer. A matting agent, e.g., colloidal silica, corn or rice starch particles, or mixtures thereof, etc., can be present in the overcoat layer. Suitable elements are disclosed in U.S. Pat. Nos. 4,173,673 and 4,229,517 which are incorporated by reference.

Imagewise exposure to actinic radiation, e.g., in the region 300 nm and above, preferably 350 to 400 nm, produces hardened areas in the photopolymerizable layer corresponding to the transparent areas of the stencil or process transparency through which the element is exposed. Development of the elements after exposure is preferably by washout of unexposed areas down to the base with a solvent for the unexposed areas. Continued action of the solvent during development undercuts (i.e., removes material beneath the edges of) the exposed, hardened areas; since the high optical density of the layer causes a gradient in degree of polymerization or hardening through the thickness of the layer, with the greatest degree of polymerization or hardening at the surface of the layer. The remaining image areas consist of a hardened upper skin which rests on a softer undervolume having a lesser degree of polymerization or hardening. The sheet support of the elements supports the exposed areas of the developed mask and in combination with the removable cover sheet or overcoat layer provides protection against oxygen inhibition on exposure.

Photopolymerizable materials are particularly suitable for the layer since they can be washed out with solvent in unexposed areas and undercut easily. Preferred elements for use in the process of this invention therefore comprise a transparent support, a transparent cover sheet or overcoat layer, and a single photopolymerizable layer, not more than 0.0006 inch (0.015 mm) thick, between the support and cover sheet or overcoat containing:
  a. An ethylenically unsaturated compound capable of forming a high polymer by free radical initiated, chain propagating, addition polymerization, 7.5–35% by weight,
  b. an organic polymeric binder, 10–75% by weight,
  c. a free radical generating addition polymerization initiator system activatable by actinic radiation, 0.1–25% by weight, and
  d. an actinic radiation absorbing material, 0–40% by weight, present in such concentration as to impart an optical density to the photopolymerizable layer of at least 3.0 over at least the spectral range of 300 to 400 nm.

Particularly preferred are such elements having a thickness of not more than about 0.0004 inch (about 0.010 mm) having an optical density in the photopolymerizable layer of at least 4.0.

In a particularly preferred element the polymeric binders are selected so that the unexposed photopolymerizable composition is soluble in predominantly aqueous solutions, e.g., dilute aqueous alkaline solutions, but upon exposure to actinic radiation becomes relatively insoluble therein. Typically, polymers which satisfy these criteria are carboxylated, e.g., vinyl addition polymers containing free carboxylic acid groups. However, a wide variety of binders may be used, as disclosed in prior art photopolymerizable compositions, where aqueous development is not required.

The above-described elements are versatile in that they can be used as litho masks and as "photomasks". A mask suitable for contact speed lithographic work is readily provided by the above elements by, for example, imagewise exposing the element with a halftone screen through the cover sheet or overcoat layer, followed by peeling off the cover sheet or dissolving the overcoat layer partially or completely, and then developing by washing out the unexposed areas to leave a suitable dot-etchable mask on the support film. Of course, in this application, dyes or pigments, e.g., colloidal carbon, would be added to the photopolymerizable layer so that the image would be opaque in both the ultraviolet and visible regions of the spectrum.

Alternatively, a suitable "photomask" for use in exposing photoresists and the like can be provided by a slightly different process. In this instance, for example, after removing the cover sheet or completely or partially removing the overcoat layer, the photopolymerizable layer on a temporary support can be laminated to a dimensionally stable and rigid support, for example, optical glass. Then, after lamination and exposure, the temporary support is removed and solvent development of the photopolymerizable layer yields the photomask on the rigid support. In this application, the layer may contain dyes or pigments absorbing throughout at least the 350 to 400 nm range. Thus, the photomask can be substantially transparent in at least a portion, e.g., a major portion, of the visible region of the spectrum, but be substantially opaque in the actinic region (i.e., the region of the spectrum used to initiate photopolymerization). For example, the photopolymerizable layer can transmit light in the magenta, cyan or yellow regions of the visible spectrum.

The above-described elements are preferably used as a litho mask. The element is exposed with a halftone screen and developed. When it is desired to correct tone values in the image, development is carried out further to undercut the halftone dots in the image and permit size reduction of the dots. Where development is carried out to the extent causing undercutting, the layer must be very thin so that dots in highlight areas are not completely removed by the etching process. If the layer is too thick, small dots which comprise a photohardened cap preferably not more than one-third the thickness of the layer resting on a tall column of soluble, unexposed material, are exceedingly fragile and subject to breaking off.

The photopolymerizable layer must have an optical density great enough to produce with a very thin layer an opaque image useful as a mask. Since dot-etching is to be practiced, high optical density is also required to produce a gradient in degree of polymerization.

Duplicate dot etchable image masks may be prepared from elements containing o-nitroaromatic photoinhibitors using a double-exposure process. Such elements and processes are disclosed in U.S. Pat. Nos. 4,162,162, 4,198,292, and 4,269,933 which are incorporated by reference.

In photopolymerizable compositions the molecular weight of at least one component of the composition is increased by exposure to actinic radiation, causing a change in the rheological and thermal properties of the exposed areas and rendering the exposed areas relatively less soluble in solvents than the unexposed areas, thereby producing a solvent developable image. Photopolymerizable compositions for use in the process of this invention usually comprise a photoinitiator, an actinic radiation absorber to opacify the element in the actinic region, a polymerizable monomer, and a polymeric binder, as described further below.

(a) The Photoinitiator

The photopolymerizable composition contains an organic, free-radical generating system activatable by actinic radiation, i.e., 300 nm and above, which initiates polymerization of the ethylenically unsaturated compound and does not subsequently terminate the reaction. The free-radical generating system should have at least one component that has an active radiation absorption band with a molar extinction coefficient of at least about 50 within the range of about 300 to 500 nm. "Active radiation absorption band" means a band of radiation which is active to produce the free radicals necessary to initiate the polymerization. The free-radical generating system can comprise one or more compounds which directly furnish free radicals when activated by radiation. It can also comprise a plurality of compounds, one of which yields free radicals after having been caused to do so by a sensitizer which is activated by the radiation.

Useful photoinitiators include aromatic ketones such as benezophenone, Michler's ketone (4,4'-bis-(dimethylamino)benzophenone), 4,4'-bis(diethylamino) benzophenone, 4-methoxy-4'-dimethylaminobenzophenone, 2-ethylanthraquinone, phenanthraquinone, and other aromatic ketones; benzoin, benzoin ethers such as benzoin methyl ether, benzoin ethyl ether and benzoin phenyl ether, methylbenzoin, ethylbenzoin and other benzoins; and 2,4,5-triarylimidazole dimers such as 2-(o-chlorophenyl)-4,5-diphenylimidazole dimer, 2-(o-chlorophenyl)-4,5-(m-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer, 2-(p-methylmercaptophenyl)-4,5-diphenylimidazole dimer, and the like disclosed in U.S. Pat. No. 3,479,185, in British Pat. No. 1,047,569, published Nov. 9, 1966, and U.S. Pat. No. 3,784,557.

Particularly useful initiators are the 2,4,5-triarylimidazole dimers (also known as hexaarylbiimidazoles). These are used with a free-radical producing electron donor agent, such as 2-mercaptobenzoxazole, leuco crystal violet or tris(4-diethylamino-2-methylphenyl)-methane. Such sensitizers as Michler's ketone may be added. Various energy transfer dyes, such as Rose Bengal and Eosin Y, can also be used. Additional examples of suitable initiators are disclosed in U.S. Pat. No. 2,760,863. Other useful systems employ a triarylimidazole dimer and a free-radical producing electron donor agent, with or without the use of a sensitizing compound as described in U.S. Pat. No. 3,479,185. Another useful group of initiators is those mixtures described in U.S. Pat. No. 3,427,161 which is incorporated by reference.

The free-radical generating system is employed in a concentration sufficient to initiate polymerization, which is usually about 0.1–25% by weight based on total composition, and preferably about 2 to 20% by weight.

(b) Actinic Radiation Absorber

Compounds, in addition to the photoinitiator system, effective in absorbing actinic radiation, which for most photopolymerizable compositions includes at least the range of 350 to 400 nm, can be present in the layer in relatively high concentrations to provide a very opaque mask and cause a polymerization gradient required for image undercutting. Such a gradient is provided in such compositions by an optical density of at least 3.0 in the layer over at least the spectral range of 350 to 400 nm inclusive. Mixtures of actinic radiation absorbing photoinitiator systems, dyes, and pigments are frequently used to provide the absorption over the visible and actinic range providing an optical density of at least 3.0 throughout it or at least over the range of 300 to 500 nm.

Examples of ultraviolet dyes, ultraviolet absorbors and other dyes which can be used are listed below:

2,2'-dihydroxy-4-methoxy-benzophenone
4-dodecyloxy-2-hydroxybenzophenone
2,4-dihydroxybenzophenone
hydroxyphenylbenzotriazole
2(2'-hydroxy-5'-methoxyphenyl)benzotriazole
resorcinol-monobenzoate
2-hydroxy-4-methoxybenzophenone
2,2'-dihydroxy-4,4'-dimethoxy-benzophenone
2,2',4,4'-tetrahydroxybenzophenone
2-hydroxy-4-methoxy-benzophenone-5-sulfonic acid (also sodium salt of above)
ethyl-2-cyano-3,3-diphenylacrylate
2-ethylhexyl-2-cyano-3,3-diphenylacrylate
Luxol® Orange GRL Color Index #25 (Solvent Orange)
Luxol® Orange GS Color Index #24 (Solvent Orange)
Luxol® Orange R Color Index #20 (Solvent Orange)
Plasto® Orange M Color Index #21 (Solvent Orange)
Plasto® Orange RS Color Index #22 (Solvent Orange)
Grasol®
Fast Orange 2RN Color Index #33 (Solvent Orange)
Oil Orange Color Index #12055 (Solvent Yellow #14)
Sudan Orange RA Color Index #12055 (Solvent Yellow #14)
Luxol® Yellow G Color Index #45 (Solvent Yellow)
Luxol® Yellow T Color Index #47 (Solvent Yellow)
Plasto® Yellow GR Color Index #39 (Solvent Yellow)
Plasto® Yellow MGS Color Index #40 (Solvent Yellow)
Oil Yellow 3G Color Index #29 (Solvent Yellow)
Oil Yellow N Color Index #2 (Solvent Yellow)
Sudan Yellow Color Index #30 (Solvent Yellow)
Luxol® Fast Blue AR Color Index #37 (Solvent Blue)
Luxol® Fast Black L Color Index #17 (Solvent Black)
Primrose Yellow Color Index #77603 (Pigment)
Chrome Yellow Light Color Index #77603 (Pigment)
Chrome Yellow Medium Color Index #77600 (Pigment)
Dispersed Manganese dioxide
Toluidine Yellow GW Color Index #71680 (Pigment)
Molybdate Orange Color Index #77605 (Pigment)
Dalamar Yellow Color Index #11741 (Pigment)
Green Gold Color Index #12775 (Pigment)
Graphtol Yellow Color Index Pigment Yellow #61
Graphtol Orange Color Index Pigment Orange #13
Colloidal carbon is a particularly preferred pigment.

To obtain an optical density in a thin layer of at least 3.0 throughout the 350 to 400 nm region frequently requires a high percentage of dyes and/or pigments, usually between 15–40% by weight, of the photopolymerizable layer. When the element is to serve as a mask for only a limited number of exposures to ultraviolet radiation a high concentration of photoinitiator alone is sufficient to provide the required optical density. Thus no dye or pigment need be present in the photopolymer layer. Preferably, however, to provide a mask suitable for many exposures high concentrations of ultraviolet stable dyes and/or pigments are present.

(c) The Monomer

A large number of useful monomers is available, generally characterized by one or more terminal ethylenic groups. Among the suitable monomers may be mentioned various vinyl and vinylidene monomers, e.g., vinyl carboxylates, alpha-alkyl acrylates, alpha-substituted acrylic acids and esters thereof, vinyl esters, vinyl hydrocarbons, acrylic and alpha-substituted acrylic acid esters of the polymethylene glycols and ether alcohols, all as disclosed in U.S. Pat. Nos. 2,760,863 and 2,791,504; the various compounds disclosed in U.S. Pat. No. 2,927,022 and especially those having a plurality of addition-polymerizable ethylenic linkages, particularly when present as terminal linkages, and more especially those wherein at least one and preferably most of such linkages are conjugated with a doubly bonded carbon, including carbon doubly bonded to carbon or to such hetero-atoms as nitrogen, oxygen and sulfur; esters of pentaaerythritrol compounds of the kind disclosed in U.S. Pat. No. 3,261,686; and compounds of the kind described in U.S. Pat. No. 3,380,831; e.g., the reaction product of trimethylolpropane, ethylene oxide, and acrylic and methacrylic acids.

The concentration of the monomer or monomers employed is normally about 7.5–35% by weight based on the total solids of the composition, and preferably between 15–25%.

(d) The Binder

The binder used is an organic polymeric material that is preferably solid at 50° C., and it is necessary that the binder be compatible with the polymerizable monomer and the polymerization initiator system. It may frequently be desirable, but it is not required, that the binder be thermoplastic. The binder may be of the same general type as the polymerizable monomer being used and may be soluble therein and plasticized thereby.

A wide variety of suitable binders, both thermoplastic and nonthermoplastic, is disclosed in U.S. Pat. No. 3,060,023, e.g., cellulose ethers or esters; polyalkylene ethers; condensation polymers of glycols with dibasic acids; polymers and copolymers of vinyl esters; acrylic acids and esters; polyvinyl alcohol; cellulose; phenolic resins; and the like. Other binders, including a number of vinylidene polymers, are disclosed in U.S. Pat. Nos. 2,760,863 and 2,791,504. Still other useful binders are the N-methoxymethyl polyhexamethylene adipamide mixtures of British Pat. No. 826,272, the polyester, polyacetal or mixed polyesteracetal mixtures of U.S. Pat. No. 2,892,716; the fusible polyvinyl alcohol derivatives of U.S. Pat. No. 2,902,365; the fusible blends of selected organic-soluble, base-soluble cellulose derivatives of U.S. Pat. No. 2,902,365; the fusible blends of selected organic-soluble, base-soluble cellulose derivatives of U.S. Pat. No. 2,927,022; the polyvinyl acetals having extralinear vinylidene groups of U.S. Pat. No. 2,902,710; the linear polyamides containing extralinear N-acrylyloxymethyl groups of U.S. Pat. No. 2,972,540; and the 1,3-butadienes of U.S. Pat. No. 3,024,180.

The binder or binder mixture usually comprises between 10–75%, by weight, of the photopolymerizable layer.

Particularly preferred as binders are acidic, polymeric, organic compounds since the photopolymerizable composition resulting is developable in solely aqueous alkaline solvent devoid of organic solvents. This is advantageous since organic solvents are costly, may be hazardous with respect to toxicity and/or flammability, may become scarce due to petrochemical shortages, and may pollute the air and water.

One class of film-forming binders which is soluble in aqueous alkaline media is vinyl addition polymers containing free carboxylic acid groups, which are prepared from 30 to 94 mole percent of one or more alkyl acrylates and 70 to 6 mole percent of one or more alpha-beta-ethylenically unsaturated carboxylic acids, and more preferably prepared from 61 to 94 mole percent of two alkyl acrylates and 39 to 6 mole percent of an alpha-beta-ethylenically unsaturated carboxylic acid. Suitable alkyl acrylates for use in preparing these polymeric binders include methyl acrylate, ethyl acrylate, propyl acrylate, buty acrylate, methyl methacrylate, ethyl methacrylate, butyl methacrylate, etc. Suitable alpha-beta-ethylenically unsaturated carboxylic acids include acrylic acid, methacrylic acid and the like. Binders of this type, including their preparation, are described in German Application, OS No. 2,320,849, published Nov. 8, 1973.

The advantages of using acidic binders can also be obtained by selecting a performed, compatible macromolecular polymeric binding agent which is a copolymer of (1) a styrene-type of a vinyl monomer and (2) an unsaturated carboxyl-containing monomer, as described in detail in British Pat. No. 1,361,298.

Another preferred photopolymerizable composition is obtained by using a preformed, compatible macromolecular polymeric binding agent mixture, the components thereof taken from two selected classes. The use of the mixtures as described in British Pat. No. 1,507,704, eliminates the need for organic solvents in developing. These are mixtures of two types of binders. The first type is preferably selected from a copolymer of vinyl acetate and crontonic acid; a terpolymer of ethyl acrylate, methyl methacrylate, and acrylic acid; and cellulose acetate succinate. The second type is preferably selected from toluene sulfonamide formaldehyde; a copolymer of methyl methacrylate and methacrylic acid; a terpolymer of methyl methacrylate, ethyl acrylate, and hydrogen maleate; a terpolymer of vinyl chloride, vinyl acetate, and maleic acid; a copolymer of styrene and maleic anhydride; and a terpolymer of methyl methacrylate, ethyl acrylate, and methacrylic acid.

Photopolymerizable elements can be prepared by coating the photopolymerizable compositions from solvents onto supports in accordance with usual coating practices. Suitable support materials include films composed of high polymers, which are cast as films from molten polymer, such as polyamides, e.g., polyhexamethylene sebacamide, polyhexamethylene adipamide; polyolefins, e.g., polypropylene; polyesters, e.g., polyethylene terephthalate, polyethylene terephthalate/isophthalate; vinyl polymers, e.g., vinyl acetals, vinylidene chloride/vinyl chloride copolymers, polystyrene, polyacrylonitrile; and cellulosics, e.g., cellulose acetate, cellulose acetate/butyrate, cellophane. A particularly preferred support material is polyethylene terephthalate film of the kind described in Alles et al., U.S. Pat. No. 2,627,088, and Alles, U.S. Pat. No. 2,779,684, with or without the surface coating described in the former patent. The support may have a resin "sub" or other layer thereon which may or may not be soluble and which is considered part of the support. However, the total thickness of the photopolymerizable layer and any soluble sub or underlayer should not exceed 0.0006 inch (0.015 mm). By "soluble" is meant solubility in a solvent in which the photopolymerizable layer is developable. Preferred soluble sub layers have a thickness not exceeding about 0.0002 inch (0.005 mm). Where the particular application does not require that the base support be transparent, the photopolymerizable composition may usefully be coated on an opaque support, such as paper, especially water-proof photographic paper; thin metal sheets, especially aluminum and copper sheets, cardboard and the like. The optimum coating thickness for a particular purpose will depend on such factors as the use to which the coating will be put, the particular light-sensitive composition employed, and the nature of other compounds which may be present in the coating. Preferred dry coating thicknesses for the photopolymerizable layer can be from about 0.0001 to about 0.0003 inch (0.0025 to about 0.008 mm).

Even after evaporation of the solvent, many of the photopolymerizable coatings made from the various components outlined above are somewhat soft, sticky, or tacky. To facilitate storage and handling and to protect against oxygen inhibition during exposure, there is applied a removable cover sheet or overcoat layer, which may be either a previously cast film or an additional coating. The cover sheet is a nonphotosensitive sheet that it is completely removable from the entire photopolymerizable layer in one operation, i.e., by stripping. A convenient and suitable material for a cover sheet that can be mechanically stripped off is any of the several commercially available varieties of polyethylene terephthalate or polypropylene film. Alternatively, polymeric materials, e.g., polyvinyl alcohol, gelatin, etc., may be coated in solution over the photopolymerization stratum to leave, after removal of solvent, a dry overcoat layer, which depending on its composition, is at least partially soluble in or permeable to the solvent for the photopolymerizable layer. Some overcoat layers are described in U.S. Pat. No. 3,458,311.

An element containing an image-yielding photopolymerizable stratum is made by coating a layer of a photopolymerizable composition disclosed herein on a suitable film support. After drying the photopolymerizable stratum, there is laminated to the surface thereof a removable cover sheet or coated thereon an overcoat layer. The photopolymerizable composition is preferably coated to give a dry coating thickness of about 0.0002 inch (50 mg/dm$^2$) (0.0051 mm). A suitable support film may be chosen from a wide variety of films composed of high polymers, e.g., polyamides, polyolefins, polyesters, vinyl polymers, and cellulose esters and may have a thickness of from 0.00025 inch (0.006 mm) to 0.008 inch (0.203 mm) or more. If exposure is to be through the support and before removing the support film, it must, of course, transmit a substantial fraction of the actinic radiation incident upon it. If the support film is removed prior to exposure, no such restrictions apply. If the support is to remain on the layer, as in the case of a litho mask, it must be transparent. A particularly suitable film is a transparent polyethylene terephthalate film having a thickness of about 0.004 inch (0.102 mm). Suitable removable cover sheets may be chosen from the same group of high polymer films described above and can have the same wide range of thicknesses. Where exposure is to be through the cover sheet or layer, the same should be transparent to actinic radiation. A cover sheet of 0.0005 inch thick (0.013 mm) polyethylene terephthalate is especially suitable. Support and cover films as described above provide good protection to the photopolymerizable layer. The overcoat layers have also been described above.

Preferred photopolymerizable layers have a thickness of less than 0.0004 inch, e.g., about 0.0003 inch (about 0.008 mm). Thicknesses of 0.0002 inch (0.0051 mm) to about 0.0003 inch (about 0.008 mm) are particularly preferred. The optical density of the layer, which is the result of the light absorbance of the radiation absorber, the photoinitiating system, and all other materials in the layer, is at least 3.0 and preferably at least 4.0. A layer having an optical density of 3.0 in the actinic region absorbs 99.9% of the incident actinic radiation, while a layer with an optical density of 4.0 absorbs 99.99%.

In carrying out the process to prepare an etchable mask, a photopolymerizable element is prepared as already described. The element is then exposed to actinic radiation, preferably through the transparent cover sheet or overcoat layer. The exposure may be by means of a light source which is rich in ultraviolet radiation through a halftone image transparency, e.g., process negative or positive (an image-bearing transparency consisting solely of substantially opaque and substantially transparent areas where the opaque areas are substantially of the same optical density). The transparency may also have a line image such as engineering drawings. The image or transparency may or may not be in contact with the surface of the element, i.e., contact exposure or projection exposure. For exposures through transparent film supports the time required will range from a few seconds to several minutes depending on the intensity of the exposing radiation and the inherent photographic speed of the composition. After exposure, the cover sheet or sheet support through which the element was exposed is removed, and the exposed layer with its exposed, hardened areas and its unexposed or underexposed, unhardened areas is developed by removal of the latter from the element. The removal of the unexposed areas may be accomplished by treating the side of the element which was exposed with the developer solution, thereby washing out the unexposed areas. Alternatively, if an overcoat layer is present instead of a cover sheet, the developer for the unexposed photopolymerizable layer will remove the overcoat layer completely above the unexposed areas and at least partially above the exposed areas.

Since free-radical generating initiators activatable by actinic radiation generally exhibit their maximum sensitivity in the ultraviolet range, the radiation source should usually furnish an effective amount of this radiation. Both point and broad radiation sources are effective. Such sources include carbon arcs, xenon arcs, mercury vapor arcs, fluorescent lamps with ultraviolet radiation emitting phosphors, argon glow lamps, electronic flash units and photographic flood lamps. Of these, the tungsten 1000-watt quartz iodide lamp is most suitable. The sunlamp mercury-vapor arcs are customarily used at a distance of 3.8-61 cm from the photopolymerizable layer. The point sources are generally used at a distance of 50-125 cm from the element. It is noted, however, that in certain circumstances it may be advantageous to expose with visible light, using a photoinitiator sensitive in the visible region of the spectrum. In such cases, the radiation source should furnish an effective amount of visible radiation. Many of the radiation sources listed above furnish the required amount of visible light.

As indicated above the element is generally developed by washing out with a suitable solvent the unexposed, unhardened, soluble portions of the photopolymerizable layer on the side of the layer that was exposed. This may be carried out by impingement of spray jets, with agitated immersion, brushing or scrubbing, to leave the desired colored, hardened, insoluble image. The result is a resist image which has sufficient opacity in the actinic region to be used as an intermediate element, "master", or mask for further exposing photosensitive compositions. The resist image is subjected to "etching", which is the chemical undercutting and subsequent removal of the edges of the image areas. As indicated above, dots as well as lines can be etched. In the process of this invention, staging solution is applied to portions of the resist image to be protected and is dried before etching of selected uncovered image areas is carried out.

The developer solvent is a fluid in which the unexposed areas are sufficiently soluble to be removed from the support and in which the exposed areas are relatively insoluble. The developer solvent selected therefore depends upon the photopolymerizable composition. Thus, the solvent used in coating the composition can be used. Weakly acidic photopolymerizable compositions may be conveniently developed with solvent mixtures as disclosed in U.S. Pat. No. 3,475,171. The more preferred aqueously developable photopolymerizable compositions are developed with aqueous bases, i.e., aqueous solutions of water-soluble bases in concentrations generally in the range from 0.01% to 10% by weight.

Suitable bases for the development include the alkali metal hydroxides, e.g., lithium, sodium and potassium hydroxide; the base-reacting alkali metal salts of weak acids, e.g., lithium, sodium, and potassium carbonates and bicarbonates; ammonium hydroxide and tetrasubstituted ammonium hydroxides, e.g., tetramethyl-, tetraethyl-, trimethylbenzyl-, and trimethylphenyl-ammonium hydroxides, sulfonium hydroxides, e.g., trimethyl-, diethylmethyl-, dimethylbenzyl-sulfonium hydroxides, and the basic soluble salts thereof, e.g., the carbonates, bicarbonates and sulfides; alkali metal phosphates and pyrophosphates, e.g., sodium and potassium triphosphates and sodium and potassium pyrophosphates; tetra-substituted (preferably wholly alkyl) phosphonium, arsonium, and stibonium hydroxide, e.g., tetramethylphosphonium hydroxide.

The same solvents would also be useful in the dot-etch process, wherein the partially hardened dot is undercut and then reduced in size by mechanical abrasion. As indicated above, the stage resulting from the process of this invention is substantially insoluble in the dot etching solvents.

The photopolymerizable element can be developed in a low cost, automatic processor which consists of an immersion development compartment and a water spray wash section such as disclosed in U.S. Pat. No. 4,142,194 which is incorporated by reference. At the end of the process the film is dried. The whole process requires less than one minute.

The etching process after the application of the staging solution of this invention may be carried out by continuing development until substantial undercutting of exposed areas has occurred and then reducing the size of the exposed areas by removing material from the edges of their upper surfaces (i.e., the surfaces that were exposed to actinic radiation).

In making masks for exposing litho plates, an exposed and developed mask is usually made and then examined by a color proofer who determines whether tone correction is required. This can be done by actually making a litho plate (a "press proof"), by measuring the halftone dots with a densitometer and comparing the colors in the original to color chips keyed to dot size, by a special color proofing film (as described in U.S. Pat. No. 3,649,268 or 4,247,619), or by any other suitable method of color proofing. If it is determined that tone correction is desired, the mask can be dot-etched by applying staging solution of this invention and returning it to the developer apparatus which is equipped with spray nozzles or other means to provide the mechanical action for dot-etching, e.g., as disclosed in the aforementioned U.S. Pat. No. 4,142,194. The amount of dot-etching will be proportional to the amount of time in the developer apparatus, so that the process of tone correction by dot-etching can be quite easily controlled.

A major utility of dot-etching is in lithographic plate making, wherein a mask of the invention is one of a plurality of color separation masks and reducing the size of the exposed areas (dots or lines, if present) is carried out to an extent whereby a composite color image produced with the masks (on a lithographic plate or on a proofing film) has the same tonal balance as the original color image.

The elements are also useful as color-coded photomasks. Such masks can be used to expose photosensitive printing plates which will print yellow, magenta, cyan process colors, and usually also black, thus forming a full-color reproduction of the original. The masks themselves are colored in these shades and thus provide a simple, rapid method for proofing.

Color-coded photomasks meet the optical density and thickness requirements set forth above, i.e., have an optical density throughout the actinic region of at least 3.0 and a thickness no greater than 0.015 mm. The high optical density is achieved by adding relatively high concentrations of ultraviolet absorbers to the photopolymerizable layer. Each layer is also colored in a visible region of the spectrum with transparent dyes or pigments corresponding with inks to be later used; generally yellow, magenta, cyan and black.

In use, a printer desiring to prepare full-color prints of a process transparency, would expose the yellow photomask of this invention to a halftone image of the yellow component of the process transparency, the magenta photomask to the magenta component, the cyan photomask to the cyan component, and, usually, a black photomask to the gray-to-black component. After exposure and development, the imaged masks would be assembled, one on top of the other in register, to yield a full color proof of the original, e.g., when viewed with transmitted light. If the color reproduction was satisfactory, each imaged photomask would be used for exposing a positive-working photosensitive printing plate, which when processed and inked with an ink corresponding in color to the color of the photomask, would yield prints of that color. Multiple printing from plates exposed through each of the yellow, magenta, cyan, and black imaged masks, and inked accordingly, would yield a faithfully reproduced full-color print of the original process transparency.

At other times, when the color-coded imaged photomasks have been assembled for proofing, it may be observed that the full color proof is, for example, too yellow, or too red, etc., in certain regions. In this instance, the imaged photomask corresponding to the excess color would be corrected by applying the staging solution of this invention to selected areas of the proof and then dot-etching the uncovered areas. After dot-etching, the stage would be removed and the color-coded imaged photomasks would be reassembled and inspected again. Further corrections may be necessary, and they would be made until the assembled color-coded masks gave the full-color reproduction desired. When satisfactory, each mask would then be used to expose a photosensitive printing plate.

The color-coded photomasks, when assembled in register, provide a very convenient proofing system. The above description applies only to positive-working photosensitive printing plates. When negative-working plates are to be exposed, an extra process step is involved. Each color-coded mask is used to prepare a contact lithographic negative film, which is then used for modulating exposure of the printing plate. Alternatively, duplicate color coded masks can be made and used directly as described in U.S. Pat. Nos. 4,162,162 and 4,198,242.

INDUSTRIAL APPLICABILITY

Dot-etching photopolymer layers is an exacting process whereby halftone dot and/or line images are reduced in size by mechanical action on the image. Staging solutions are useful in protecting areas of the photopolymer layer from being dot-etched. The staging solutions must not attack the photopolymer layer or images formed therein and should remain in the areas where they are applied without spreading onto unprotected areas. The dry stage should be removed easily by standard solvents subsequent to the dot-etching treatment without damage to the image. The staging solution useful in this inventive process possesses an improved balance of properties including: insolubility during dot-etching, solubility for ease of removal after dot-etching, proper flow characteristics wherein the solution remains solely in the applied areas, and proper evaporation rate for solvent whereby the solution drys quickly and efficiently. Uses for the dot-etched photopolymer elements have been described above.

EXAMPLES

The following examples illustrate the invention wherein the percentage and parts are by weight. The molecular weights unless otherwise designated for the polymers present in the examples are number average molecular weights (Mn). The Mn for the polymers described herein can be determined by gel permeation chromatography employing a butadiene standard or other standard known to those skilled in the art.

EXAMPLE 1

A dot-etchable photopolymerizable element is prepared as follows:

Overcoat Formulation:
Starch Dispersion:

A.   In a 1-liter stainless steel beaker is slurried Rice starch, 75.2 g, Remy Type B6 Neutral, particle size in water dispersion, 4 to 6 μm, Celanese Corp., New York, New York, and Distilled water, 200.0 g.

B.   In a 5-liter stainless steel pot is mixed Vinol® 107, 13% solids in water[1], 202.0 g, and Distilled water, 3450.0 g.

The contents of beaker (A) is added to pot (B) rinsing beaker (A) twice with 100.0 g of distilled water, adding the rinse water to pot (B). The mixture is dispersed using a Waring® blender.

[1] 98.0–98.8% hydrolyzed polyvinyl alcohol, Brookfield Model LVF viscosity, 6–8 cps/4% aqueous/20° C./#1 spindle/60 rpm, Air Products and Chemical Co., Inc.

Overcoat Composition
In a 10-liter stainless steel pot are mixed in succession:

| Component | Amount (g) |
|---|---|
| Distilled water | 2469.0 |
| Polyethylene wax/water dispersion Misco Products Co., Reading, PA | 253.0 |
| Colloidal Silica, Ludox® AM, aqueous colloidal sol of alumina modified silica particles containing about 30% solids, pH at 25° C. 8.6–9.3, E. I. du Pont de Nemours and Company, Wilmington, DE | 140.0 |
| Vinol® 107, 13% solids in water, described above | 1413.0 |
| Starch dispersion, described above | 4127.2 |
| Fluorocarbon surfactant, 5% solids in water | 30.0 |

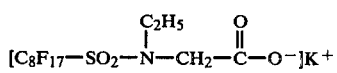

Undercoat Formulation
Pigmented Chips
In a Banbury mixer at 77 r.p.m. is mixed for six minutes from the time the mix temperature reaches 200° C. the following compositions:

| Component | Amount (%) |
|---|---|
| Terpolymer: ethyl acrylate (56), methyl methacrylate (37), acrylic acid (7) (Acid No. 76-85; viscosity 325 cps[1] weight ave. mol. wt. about 260,000) | 43.2 |
| Copolymer of styrene/sec. butyl maleate, 1.4/1, (Acid No. 190, viscosity 8 cps[2], weight av. mol. wt. 10,000) | 10.8 |
| Carbon black, Sterling, N.J. | 45.0 |
| Stearic acid | 1.0 |

[1] Brookfield Model LVF viscosity (spindle No. 2, 60 rpm, 25° C.) 10% soln. in $CH_2Cl_2$.
[2] As in 1 above, 10% solution in acetone The mixture temperature is maintained at 200° C. or less during the mix period. The mix is calendered to 0.025 inch (0.635 mm) thick sheets which are allowed to cool to room temperature and are then broken into small chips by chopping, dicing or granuating.

In a 5-gallon (about 19 liter) stainless steel pot is mixed in order the following components:

| Component | Amount (g) |
|---|---|
| Methylene chloride | 6256.0 |
| 2-Ethoxyethanol | 450.0 |
| Copolymer of styrene/sec. butyl maleate, 1.4/1, (as described above) (allow to dissolve before proceeding) | 915.2 |
| Trimethylolpropane triacrylate | 713.6 |
| Zinc acetylacetonate complex | 32.0 |
| 2-Ethoxyethanol rinse (slurry these three components and add) | 94.0 |
| Dioctyl Sodium Sulfosuccinate | 64.0 |
| 2-Mercaptobenzoxazole | 25.6 |
| Michler's ketone | 80.0 |
| Ethyl Michler's ketone | 80.0 |
| 2,2'-Bis-(o-chlorophenyl)-4,4',5,5'-tetraphenylbiimidazole | 278.4 |
| Pigmented chips prepared as described above | 1014.4 |

This solution is coated on resin-subbed polyethylene terephthalate film base, 0.004 inch (0.10 mm), having polysilicic acid antistatic compound on the nonsubbed side. The coater is a continuous-web laboratory scale coater and dryer combination. The dry coating thickness is about 5 μm. The overcoat is then applied in a similar manner yielding a dry coating thickness of about 2 μm.

The above-identified element is imagewise exposed through a halftone transparency to the light from a 4 KW pulsed xenon light source (Macbeth Activarc® Type MK 40HL) for 45 seconds. The image element is spray developed at 85° F. (29.4° C.) with a developer composed of 840 g $K_2CO_3$, 50 g $KHCO_3$ and 16 liters water in a Crona-Lite® Model II processor manufactured by E. I. du Pont de Nemours and Company, Wilmington, Del. at a rate of 95 inches/minute (24.1 cm/minute) and water-rinsed at a temperature of 100° F. (about 38.0° C.). The image consists of opaque, shallow-relief, polymeric dot areas on the transparent support film and complementary uncovered areas where the unexposed photopolymer material is removed by development.

The image areas to be etched is visually ascertained and the rest of the image is protected by painting with a staging solution having a Brookfield Model LVF viscosity of 62.8 cps determined at 20° C./#1 spindle/60 rpm of the following composition:

| Ingredient | Amount (%) |
|---|---|
| Heptane | 7.8 |
| $C_{8-10}$ isoparaffins, Soltrol® 50, a product of Phillips Petroleum | 15.6 |
| $C_{9-11}$ isoparaffins, Soltrol® 100, a product of Phillips Petroleum | 41.1 |
| Blackhawk® 500, naturally occurring | 29.9 |

-continued

| Ingredient | Amount (%) |
|---|---|
| unsubstituted hydrocarbon resins, having melt viscosities of 10 poises at 224° C., 100 poises at 198° C., and 1000 poises at 178° C., a product of Blackhawk Resin Co., Toelle, Utah | |
| Damar A/D, naturally occurring unsubstituted hydrocarbon resin, a product of Innes Corp. | 6.2 |
| Cab-o-Sil ® PTG, fumed silica manufactured by Cabot Corp. | 2.5 |
| Automate ® Red B, C.I. No. Solvent Red 164 azo dye 70% in xylene | 1.9 |

The staging solution is dried in 5 minutes under ambient conditions to provide a stage. The areas to be etched are etched by reprocessing the staged element in the above-identified Crona-Lite ® Model II Processor at a rate of 80 inches/minute (203 cm/minute) to give about 13 seconds contact with the developer. The dot size is measured and the process repeated until the proper dot size is achieved. The reduction of dot size is from 50% dots to 40% dots with no loss in density within the dot when tested by comparing integrated density and dot size. The etched element is dried by hot air and the stage is removed by carefully wiping with the solvent Soltrol ® 50 $C_{8-10}$ isoparaffins as described above and then dried.

EXAMPLE 2

The process of Example 1 is repeated except that a staging solution of the following composition is used:

| Ingredient | Amount (%) |
|---|---|
| $C_{8-10}$ isoparaffins as described in Example 1 | 22.4 |
| $C_{9-11}$ isoparaffins as described in Example 1 | 37.1 |
| Piccovar ® AB 180, synthetic unsubstituted hydrocarbon resin having melt viscosities of 10 poises at 250° C., 100 poises at 216° C., and 1000 poises at 190° C., a product of Hercules, Inc., Wilmington, DE | 31.0 |
| Damar A/D, naturally occurring unsubstituted hydrocarbon resin, a product of O. G. Innes Corp. | 7.7 |
| Automate ® Red B (C.I. No. 164 Solvent Red 164) azo dye 70% in xylene | 1.8 |

The resulting staging solution has a Brookfield Model LVF viscosity (spindle #1, 60 rpm 20° C.) of 63 cps.

As in Example 1, for areas not protected by the dried stage, the reduction of dot size is from 50% dots to 40% dots with no loss of density within the dot when tested by comparing integrated density and dot size.

EXAMPLES 3 TO 5

The process of Example 1 is repeated with staging solution of the following compositions:

| Ingredient | Ex. 3 | Ex. 4 (Parts) | Ex. 5 |
|---|---|---|---|
| Hexane | 4.2 | — | — |
| Cyclohexane | — | — | 15.0 |
| Heptane | 25.2 | 37.5 | — |
| Soltrol ® 50 (See Ex. 1) | 8.4 | 37.5 | 23.0 |
| Soltrol ® 100 (See Ex. 1) | 4.2 | — | — |

-continued

| Ingredient | Ex. 3 | Ex. 4 (Parts) | Ex. 5 |
|---|---|---|---|
| Blackhawk ® 500 (See Ex. 1) | 18.6 | 60.0 | 20.5 |
| Damar A/D (See Ex. 1) | 4.0 | 15.0 | 4.5 |
| Cab-O-Sil ® PTG (See Ex. 1) | 0.5 | — | — |
| Cab-O-Sil ® M5 fumed silica mfg. by Cabot Corp. | — | 6.0 | — |
| Automate ® Red B (See Ex. 1) | — | 1.5 | 0.7 |
| Du Pont Oil Red B (C.I. No. 164) | 0.1 | — | — |

Each solution forms a stage which protects areas of the image during dot etching.

EXAMPLE 6

This Example illustrates the use of staging solutions to prepare color-coded photomasks useful both as an alternative proofing system and for preparing printing plates for full color printing.

A yellow, a magneta, and a cyan halftone target are prepared from correspondingly colored photopolymerizable elements as described in Example 20 of U.S. Pat. No. 4,173,673. When the three halftone targets are assembled in register to form an overlay proof it is observed that the tonal balance in a portion of the proof is judged excessive in cyan. The cyan halftone target is removed from the overlay assembly and the staging solution of Example 1 is applied to the target except in the area judged excessive. After the stage is dried the unstaged areas are dot etched by soaking the imaged film in a developer at 29° C. described in the aforementioned Example 20 for 30 seconds followed by a spray with warm water at 38° C. After drying the stage is removed as described in Example 1 above and then the targets are reassembled in register. If the proof is still judged excessive in cyan, the above steps are repeated until a proof of the desired tonal balance is achieved. Each of the targets can then be used to produce the appropriate printing plate by conventional methods.

EXAMPLE 7

A composite, multilayered photopolymerizable element capable of forming duplicate images is prepared as described in Example 7 of U.S. Pat. No. 4,162,162.

The composite element is exposed for 25 seconds to a 4 KW pulsed xenon arc at a distance of 60 inches (152.4 cm) through a photomask having a 50% tint (150 line screen) in contact with the cover sheet. The photomask is then removed, and the element reexposed for 3 minutes to the same light source through a cut-off filter which absorbs all light below 400 nm. The cover sheet is then removed and the film processed through an automatic processor (described in U.S. Pat. No. 4,142,194) at about 90 inches/minute (229 cm/minute) and 72° F. (22.2° C.) to produce a duplicate of original photomask.

A portion of the duplicate mask is protected with a stage by applying the staging solution of Example 2 above to the area with an air brush. The areas of the duplicate not protected by the dried stage are then dot etched by passing the duplicate through the processor one or more times until the desired tonal rendition is achieved. The stage is then removed as described in Example 2 to provide a corrected duplicate mask.

I claim:

1. In a process for dot-etching an imagewise exposed photopolymerizable layer wherein the layer is no more than 0.015 mm thick and has an optical density greater than 3.0 in the 300 to 400 nm region and contains a tone correctable image comprised of polymeric dots or lines having a hardened upper skin which rests on a softer undervolume having a less degree of polymerization or hardening, the process comprising applying a staging solution to areas of the image layer that it is desired to protect, drying the staging solution to provide a stage, reducing the size of the polymeric dots or lines in unprotected areas by undercutting them with a solvent for the softer undervolume and removing hardened polymer from the edges of the hardened upper skin by mechanical action on the image, and removing the stage with a solvent therefor which does not have any dilatory effect on the photopolymerized layer or image formed therein, the improvement wherein the staging solution having a Brookfield Model LVF viscosity in the range of 50 to 70 cps determined at 20° C./#1 spindle/60 rpm consists essentially of (a) at least one film forming hydrocarbon resin having a number average molecular weight in the range of about 500 to 3000 and melt viscosities of 10 poises at 237° C.±15° C., 100 poises at 207° C.±10° C., and 1000 poises at 184° C.±7° C., the resin containing greater than 50% by weight aliphatic hydrocarbons and being derived from synthetic and natural products, 25 to 50% by weight;

(b) at least one aliphatic hydrocarbon solvent which is inert to the photopolymerizable layer, 50 to 75% by weight;

(c) optionally a dye or colorant; and (c) optionally a finely divided particulate material, the weight percentages being based on the total weight of components (a) and (b).

2. A process according to claim 1 wherein the film forming hydrocarbon resin is a materially occurring unsubstituted hydrocarbon resin having melt viscosities of 10 poises at 224° C., 100 poises at 198° C., and 1000 poises at 178° C.

3. A process according to claim 1 or claim 2 wherein the aliphatic hydrocarbon solvent is a mixture of heptane, $C_{8-10}$ isoparaffins and $C_{9-11}$ isoparaffins.

4. A process according to claim 1 wherein the photopolymer layer has a thickness of no more than 0.010 mm and the optical density is at least 4.0.

5. A process according to claim 1 wherein the mechanical action is by rubbing, brushing or spraying.

6. A process according to claim 1 wherein the hardened upper skin is not more than about one-third the photopolymer layer thickness.

* * * * *